US012463455B2

(12) United States Patent
Kinuta

(10) Patent No.: US 12,463,455 B2
(45) Date of Patent: Nov. 4, 2025

(54) UNINTERRUPTIBLE POWER SUPPLY DEVICE AND CONTROL MODULE FOR UNINTERRUPTIBLE POWER SUPPLY DEVICE

(71) Applicant: FUJI ELECTRIC CO., LTD., Kawasaki (JP)

(72) Inventor: Takahiro Kinuta, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 14 days.

(21) Appl. No.: 18/078,464

(22) Filed: Dec. 9, 2022

(65) Prior Publication Data

US 2024/0195211 A1 Jun. 13, 2024

(51) Int. Cl.
*H02J 9/06* (2006.01)
*H02J 7/00* (2006.01)
*H10D 18/00* (2025.01)

(52) U.S. Cl.
CPC ............ *H02J 9/062* (2013.01); *H02J 7/0068* (2013.01); *H02J 9/068* (2020.01); *H10D 18/00* (2025.01)

(58) Field of Classification Search
CPC ........ H02J 9/062; H02J 9/068; H05K 7/1432; H05K 7/14325; H02B 1/30; H02B 1/565
See application file for complete search history.

(56) References Cited

U.S. PATENT DOCUMENTS

| | | | | |
|---|---|---|---|---|
| 2009/0015190 | A1* | 1/2009 | Siemes | H02P 1/28 318/778 |
| 2009/0039706 | A1* | 2/2009 | Kotlyar | H02J 9/062 307/64 |
| 2016/0249492 | A1* | 8/2016 | Shin | H05K 7/20909 |
| 2019/0181406 | A1* | 6/2019 | Sugeno | H01M 50/298 |
| 2020/0059163 | A1* | 2/2020 | Koshii | H05K 7/1485 |

FOREIGN PATENT DOCUMENTS

| | | | | |
|---|---|---|---|---|
| JP | 6597929 B1 | * | 10/2019 | H02J 9/062 |
| JP | 2020078214 A | * | 5/2020 | |

* cited by examiner

*Primary Examiner* — Rexford N Barnie
*Assistant Examiner* — Rasem Mourad
(74) *Attorney, Agent, or Firm* — HAUPTMAN HAM, LLP

(57) ABSTRACT

In an uninterruptible power supply device, a control module includes a thyristor unit, a control unit, and a housing that accommodates the thyristor unit and the control unit, in which the thyristor unit and the control unit are arranged in a front-rear direction intersecting a left-right direction in the housing of the control module.

13 Claims, 7 Drawing Sheets

UNINTERRUPTIBLE POWER SUPPLY DEVICE AND CONTROL MODULE FOR UNINTERRUPTIBLE POWER SUPPLY DEVICE

CROSS-REFERENCE TO RELATED APPLICATION

The priority application number JP2021-167611, an uninterruptible power supply device and a control module for an uninterruptible power supply device, Oct. 12, 2021, Takahiro Kinuta, upon which this patent application is based, are hereby incorporated by reference.

BACKGROUND OF THE INVENTION

Field of the Invention

The present invention relates to an uninterruptible power supply device and a control module for an uninterruptible power supply device, and more particularly, to an uninterruptible power supply device and a control module for an uninterruptible power supply device which include a thyristor provided in a bypass current path for outputting AC power to a load external to the device without passing through a power conversion unit.

Background Art

In the related art, an uninterruptible power supply device including a thyristor provided in a bypass current path for outputting AC power to a load external to the device without passing through a power conversion unit is known. Such an uninterruptible power supply device is disclosed in JP-A-2020-78214, for example.

JP-A-2020-78214 discloses the uninterruptible power supply device including a power conversion unit that converts power from an AC power supply, and a bypass circuit for feeding power from a bypass input power supply external to the device when the uninterruptible power supply device is stopped, such as during maintenance. The bypass circuit includes a thyristor unit including a plurality of thyristors provided corresponding to the phases of AC power fed from the bypass input power supply external to the device. Moreover, in a housing of the uninterruptible power supply device, a control device that controls power conversion of the power conversion unit is accommodated together with the power conversion unit and the thyristor unit.

Here, although not specified in JP-A-2020-78214, there is a case in which a module that accommodates the power conversion unit and a module that accommodates the thyristor unit and the control device are provided separately. In such a case, the uninterruptible power supply device is configured such that the module that accommodates the power conversion unit and the module that accommodates the thyristor unit and the control device are disposed adjacent to each other in a left-right direction.

In the uninterruptible power supply device as described above, the module that accommodates the power conversion unit and the module that accommodates the thyristor unit and the control device are disposed adjacent to each other in the left-right direction. Therefore, there is a problem that a width in the left-right direction of the entire uninterruptible power supply device is increased in a case in which a width in the left-right direction of the module configuring the uninterruptible power supply device, such as the module that accommodates the power conversion unit or the module that accommodates the thyristor unit and the control device is increased. Therefore, it is desired to suppress the increase in the width in the left-right direction of the module forming the uninterruptible power supply device, and to suppress the increase in the width in the left-right direction of the entire uninterruptible power supply device.

SUMMARY OF THE INVENTION

The present invention has been made to solve the above problems, and the present invention is to provide an uninterruptible power supply device and a control module for an uninterruptible power supply device which can suppress an increase in a width in a left-right direction of a module forming an uninterruptible power supply device and can suppress an increase in a width in the left-right direction of the entire uninterruptible power supply device.

In order to achieve the above object, a first aspect of the present invention relates to an uninterruptible power supply device including a power conversion module that includes a power conversion unit that converts power fed from an AC power supply or a battery external to the device and feeds the converted power to a load external to the device, and a control module that is disposed adjacent to the power conversion module in a left-right direction and controls power conversion of the power conversion module, in which the control module includes a thyristor unit that includes a thyristor provided in a bypass current path for outputting AC power to the load external to the device without passing through the power conversion unit, a control unit that controls the power conversion of the power conversion module, and a housing that accommodates the thyristor unit and the control unit, and the thyristor unit and the control unit are arranged in a front-rear direction intersecting the left-right direction in the housing of the control module.

In the uninterruptible power supply device according to the first aspect, as described above, the thyristor unit and the control unit are arranged in the front-rear direction intersecting the left-right direction in the housing of the control module. As a result, the width in the left-right direction of the control module can be made smaller than the width in a case in which the thyristor unit and the control unit are arranged in the left-right direction in the housing of the control module. As a result, it is possible to suppress the increase in the width in the left-right direction of the module (control module) forming the uninterruptible power supply device, and to suppress the increase in the width in the left-right direction of the entire uninterruptible power supply device.

In the uninterruptible power supply device according to the first aspect, it is preferable that the thyristor unit and the control unit are disposed in the housing of the control module to overlap each other as viewed from the front-rear direction. With such a configuration, the width in the left-right direction of the control module can be made smaller than the width in a case in which the thyristor unit and the control unit do not overlap each other as viewed from the front-rear direction in the housing of the control module. As a result, it is possible to easily suppress the increase in the width in the left-right direction of the entire uninterruptible power supply device.

In the uninterruptible power supply device according to the first aspect, it is preferable that the thyristor unit is disposed on one side in the front-rear direction with respect to a center of the housing of the control module, and the control unit is disposed on the other side in the front-rear direction with respect to the center of the housing of the control module. With such a configuration, during installation and maintenance of the device, the thyristor unit can be easily accessed from one side in the front-rear direction, and the control unit can be easily accessed from the other side in the front-rear direction. As a result, unlike a case in which both the thyristor unit and the control unit, which are arranged in the front-rear direction, are disposed in the housing of the control module to one side or the other side in the front-rear direction from the center of the housing, both the thyristor unit and the control unit can be easily accessed during installation and maintenance of the device. As a result, it is possible to improve workability during installation and maintenance of the device.

It is preferable that the uninterruptible power supply device according to the first aspect further includes an input module that is disposed on one side in the left-right direction with respect to the control module and inputs the AC power fed from the AC power supply external to the device to the control module, in which a width in the left-right direction of the control module is smaller than a width in the left-right direction of the input module. With such a configuration, the width in the left-right direction of the control module can be made smaller than a case in which the width in the left-right direction of the control module is made larger than the width in the left-right direction of the input module, so that it is possible to further suppress the increase in the width in the left-right direction of the entire uninterruptible power supply device.

In the configuration in which the input module is provided, it is preferable that a plurality of the power conversion modules is provided, the plurality of power conversion modules includes a first power conversion module that is disposed on one side in the front-rear direction on which the thyristor unit is disposed, and a second power conversion module that is disposed on the other side in the front-rear direction on which the control unit is disposed, the first power conversion module and the second power conversion module are disposed on the other side in the left-right direction with respect to the control module, and the thyristor unit and the control unit are provided in common to the first power conversion module and the second power conversion module. With such a configuration, among the plurality of power conversion modules, the first power conversion module is disposed on one side in the front-rear direction on which the thyristor unit is disposed, and the second power conversion module is disposed on the other side in the front-rear direction on which the control unit is disposed, so that it is possible to further suppress the increase in the width in the left-right direction of the entire uninterruptible power supply device than in a case in which the plurality of power conversion modules is disposed in a row in the left-right direction. In addition, the thyristor unit and the control unit are provided in common to the first power conversion module and the second power conversion module, so that it is possible to suppress an increase in the number of components and complication of the device configuration than in a case in which the thyristor unit and the control unit are provided separately for each of the first power conversion module and the second power conversion module.

In this case, it is preferable that the width in the left-right direction of the control module is smaller than a width in the left-right direction of each of the first power conversion module and the second power conversion module. With such a configuration, the width in the left-right direction of the control module can be made smaller than a case in which the width in the left-right direction of the control module is made larger than the width of each of the first power conversion module and the second power conversion module, so that it is possible to further suppress the increase in the width in the left-right direction of the entire uninterruptible power supply device.

In the configuration in which the input module is provided, it is preferable that the control module is provided with a bypass wiring that is connected to the thyristor of the thyristor unit and forms the bypass current path, and the bypass wiring includes a bypass path connector that is disposed between the thyristor unit and the control unit in the front-rear direction and is connected to a wiring of the input module. With such a configuration, it is possible to make the width in the left-right direction of the control module smaller than in a case in which the bypass path connector is disposed adjacent to the thyristor unit or the control unit in the left-right direction in the housing of the control module.

In the configuration in which the input module is provided, it is preferable that the control module is provided with an AC input wiring that is electrically connected to the power conversion unit of the power conversion module and the AC power supply external to the device, and the AC input wiring includes an AC input connector that is disposed between the thyristor unit and the control unit in the front-rear direction and is connected to a wiring of the input module. With such a configuration, it is possible to make the width in the left-right direction of the control module smaller than in a case in which the AC input connector is disposed adjacent to the thyristor unit or the control unit in the left-right direction in the housing of the control module.

In the uninterruptible power supply device according to the first aspect, it is preferable that the control module is provided with a DC wiring that is electrically connected to the power conversion unit of the power conversion module and the battery external to the device, and the control module includes a battery connection unit that is provided in an upper portion of the housing and electrically connects the battery external to the device and the DC wiring. With such a configuration, a cable or the like connected to the battery external to the device can be connected to the battery connection unit provided on the upper portion of the housing. As a result, unlike a case in which the battery connection unit is provided on a direction side of the control module to which the power conversion module is adjacent, even in a case in which the battery external to the device is disposed on a direction side on which the power conversion module is adjacent to the control module, it is possible to electrically connect the DC wiring of the control module and the battery external to the device from above the housing without passing through the power conversion module. As a result, unlike a case in which the battery connection unit is provided on a direction side of the control module to which the power conversion module is adjacent, it is possible to easily electrically connect the DC wiring of the control module and the battery external to the device.

It is preferable that the uninterruptible power supply device according to the first aspect further includes an output module that is disposed on the other side in the left-right direction with respect to the power conversion module and outputs the power converted by the power conversion unit of the power conversion module to the load external to the device, in which a width in the left-right direction of the control module is smaller than a width in the left-right direction of the output module. With such a configuration, the width in the left-right direction of the control module can be made smaller than a case in which the width in the left-right direction of the control module is made larger than the width of the output module, so that it is possible to further suppress the increase in the width in the left-right direction of the entire uninterruptible power supply device.

In order to achieve the above object, a second aspect of the present invention relates to a control module for an uninterruptible power supply device, the control module including a control unit that controls power conversion of a power conversion module including a power conversion unit that converts power fed from an AC power supply or a battery external to the device and feeds the converted power to a load external to the device, a thyristor unit that includes a thyristor provided in a bypass current path for outputting AC power to the load external to the device without passing through the power conversion unit, and a housing that accommodates the thyristor unit and the control unit, in which the control module is disposed adjacent to the power conversion module in a left-right direction, and the thyristor unit and the control unit are arranged in a front-rear direction intersecting the left-right direction in the housing.

As described above, in the control module for an uninterruptible power supply device according to the second aspect, the thyristor unit and the control unit are arranged in the front-rear direction intersecting the left-right direction in the housing. As a result, the width in the left-right direction of the control module for an uninterruptible power supply device can be made smaller than the width in a case in which the thyristor unit and the control unit are arranged in the left-right direction in the housing of the control module for an uninterruptible power supply device. As a result, it is possible to suppress the increase in the width in the left-right direction of the module (control module for an uninterruptible power supply device) forming the uninterruptible power supply device, and to suppress the increase in the width in the left-right direction of the entire uninterruptible power supply device.

The foregoing and other objects, features, aspects and advantages of the present invention will become more apparent from the following detailed description of the present invention when taken in conjunction with the accompanying drawings.

DETAILED DESCRIPTION OF THE INVENTION

Hereinafter, an embodiment embodying the present invention will be described with reference to the drawings.

Overall Configuration of Uninterruptible Power Supply Device

An overall configuration of an uninterruptible power supply device (uninterruptible power supply (UPS) or power conditioning system (PCS)) 100 according to one embodiment of the present invention will be described with reference to FIGS. 1 to 3.

Figure 1:
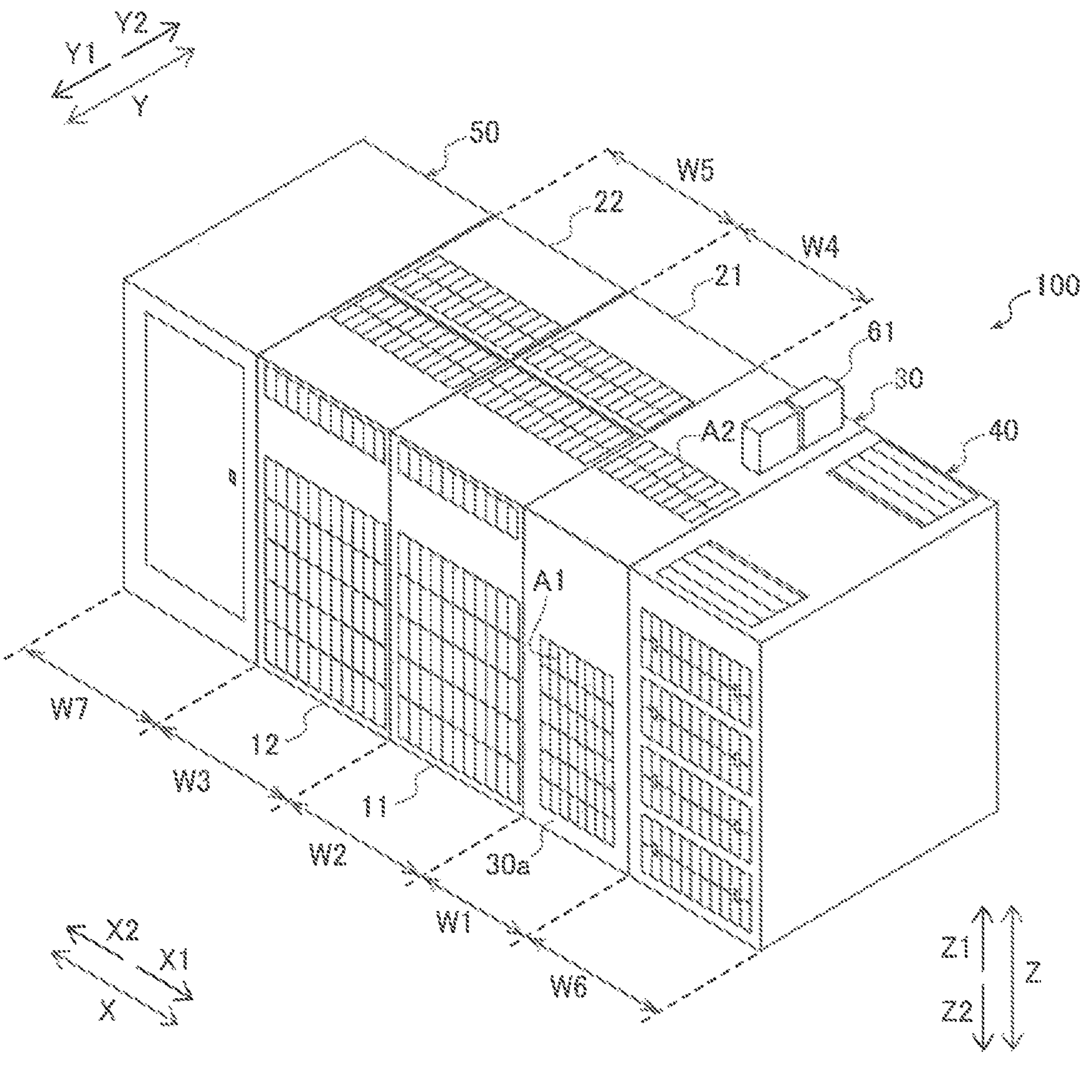
FIG. 1 is a perspective view showing an uninterruptible power supply device according to one embodiment of the present invention.

In the present embodiment, the uninterruptible power supply device 100 includes a plurality of power conversion modules (power conversion modules 11, 12, 21, and 22) as shown in FIG. 1. The power conversion modules 11, 12, 21, and 22 are configured to convert power fed from an outside of the device. The power conversion modules 11, 12, 21, and 22 are power conversion modules having the same standard. It should be noted that the power conversion modules 11 and 12 are examples of a "first power conversion module" in the scope of claims, and the power conversion modules 21 and 22 are examples of a "second power conversion module" in the scope of claims. In addition, the power conversion modules 11, 12, 21, and 22 are examples of a "plurality of power conversion modules" in the scope of claims.

In addition, the power conversion modules 11 and 12 are disposed on one side (Y1 direction side) in a front-rear direction (Y direction) with respect to the power conversion modules 21 and 22. Moreover, in the uninterruptible power supply device 100, a back side of the power conversion module 11 and a back side of the power conversion module 21 are disposed to face each other in the Y direction. In addition, in the uninterruptible power supply device 100, a back side of the power conversion module 12 and a back side of the power conversion module 22 are disposed to face each other in the Y direction. It should be noted that the back side is a side opposite to a direction (front side) in which an operator can access the devices inside the module.

In addition, the uninterruptible power supply device 100 includes a control module 30 that is disposed adjacent to the power conversion modules 11, 12, 21, and 22 in a left-right direction (X direction), and controls the power conversion of the power conversion modules 11, 12, 21, and 22. The control module 30 is a module that controls the power conversion of the entire uninterruptible power supply device 100 by controlling the power conversion of each of the power conversion modules 11, 12, 21, and 22. It should be noted that the control module 30 is an example of a "control module for an uninterruptible power supply device" in the scope of claims.

In addition, the uninterruptible power supply device 100 includes an input module 40 that is disposed on one side (X1 direction side) in the left-right direction with respect to the control module 30, and inputs AC power fed from an AC power supply 201 (see FIG. 2) external to the device to the control module 30. That is, the control module 30 is disposed on the left side of the input module 40 as viewed from the Y1 direction side.

In addition, the power conversion modules 11, 12, 21, and 22 are disposed on the other side (X2 direction side) in the left-right direction with respect to the control module 30. That is, the control module 30 is disposed on the right side of the power conversion modules 11, 12, 21, and 22 as viewed from the Y1 direction side, and the control module 30 is disposed between the power conversion modules 11, 12, 21, and 22 in the left-right direction (X direction) and the input module 40. In addition, in the present embodiment, a width W1 in the left-right direction (X direction) of the control module 30 is smaller than each of widths W2, W3, W4, and W5 in the left-right direction of the power conversion modules 11, 12, 21, and 22. In addition, in the present embodiment, the width W1 in the left-right direction (X direction) of the control module 30 is smaller than a width W6 in the left-right direction of the input module 40.

Moreover, the uninterruptible power supply device 100 includes an output module 50 that is disposed on the other side (X2 direction side) in the left-right direction with respect to the power conversion modules 11, 12, 21, and 22, and outputs the power converted by each of the power conversion modules 11, 12, 21, and 22 to a load 203 (see FIG. 2) external to the device. In addition, in the present embodiment, the width W1 in the left-right direction (X direction) of the control module 30 is smaller than a width W7 in the left-right direction of the output module 50.

In the present embodiment, the input module 40, the control module 30, the power conversion module 11 (power conversion module 21), the power conversion module 12 (power conversion module 22), and the output module 50 are disposed in this order from the X1 direction side.

In addition, the control module 30 also includes a housing 30*a* that accommodates a thyristor unit 31 and a control unit 32 (see FIG. 2), which will be described below. In addition, as shown in FIG. 1, an intake unit A1 that takes air into the housing 30*a* is provided on the Y1 direction side of the housing 30*a* of the control module 30. Moreover, an exhaust unit A2 that exhausts air from the inside of the housing 30*a* is provided on an upper surface (surface on the Z1 direction side) of the housing 30*a* of the control module 30. The intake unit A1 and the exhaust unit A2 include holes, such as slit holes provided in the housing 30*a*.

In addition, the control module 30 also includes a bus duct 61 that is provided on the upper portion of the housing 30*a* and is electrically connected to a battery 202 (see FIG. 2) external to the device. In addition, the bus duct 61 accommodates a conductor wiring, such as copper, and an insulating material that supports or coats the conductor wiring in a metal duct. It should be noted that the bus duct 61 is an example of a "battery connection unit" in the scope of claims.

Figure 2:
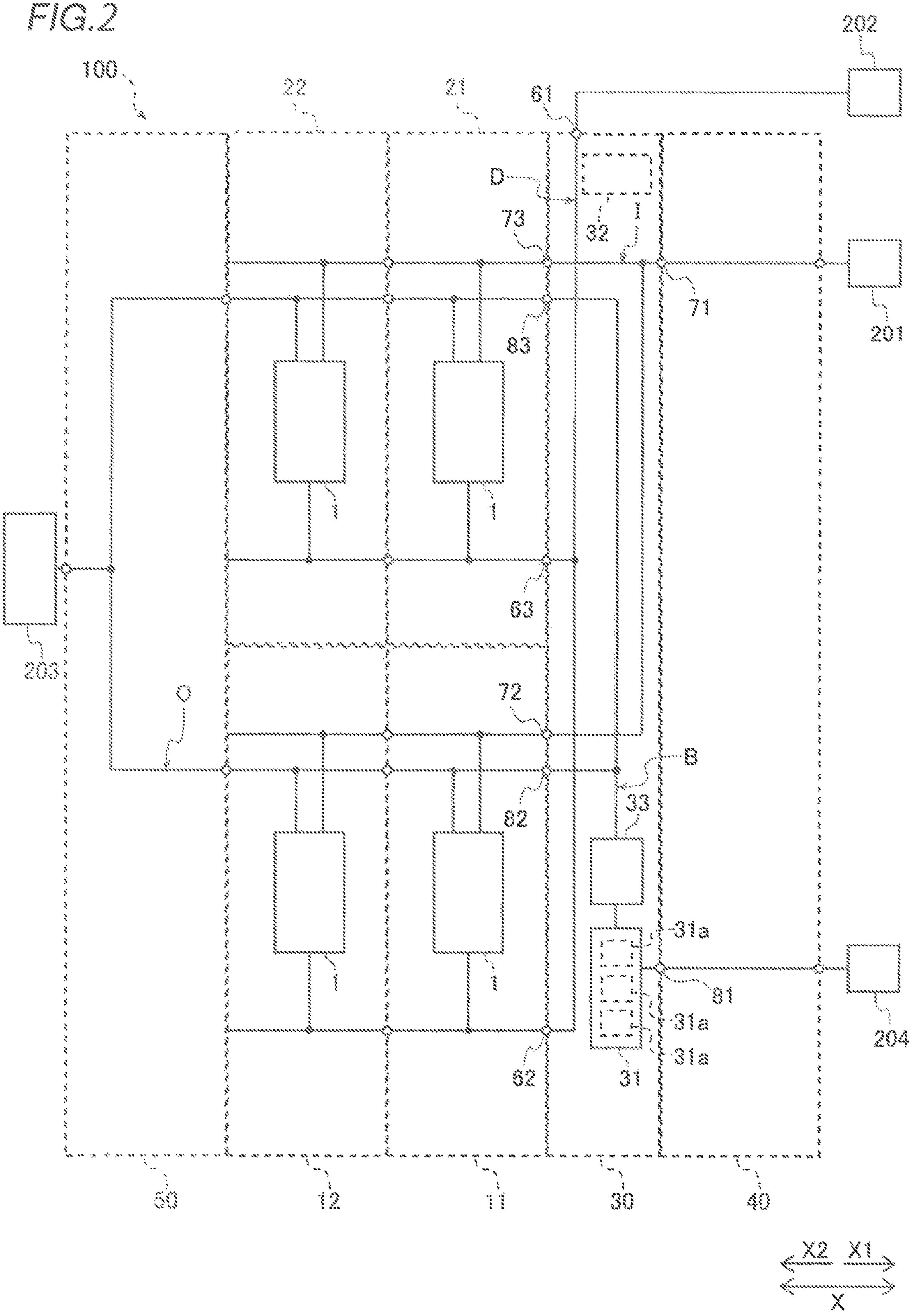
FIG. 2 is a schematic view for describing a configuration of the uninterruptible power supply device according to the embodiment of the present invention.

In addition, the power conversion modules 11, 12, 21, and 22 include a power conversion unit 1 that converts the power fed from the AC power supply 201 or the battery 202 external to the device and feeds (outputs) the converted power to the load 203 external to the device, as shown in FIG. 2.

The power conversion unit 1 includes a rectifier circuit, an inverter circuit, and a chopper circuit. The rectifier circuit has a function of converting the AC power input to the power conversion unit 1 into DC power. The chopper circuit is configured as a 3-level chopper circuit, for example. The chopper circuit has a function of transforming and outputting a voltage input from the battery 202 external to the device. The DC power input from the battery 202 is input to the chopper circuit through a conductor, a capacitor, and a DC reactor (not shown). In addition, the inverter circuit has a function of converting the DC power input from the rectifier circuit and the chopper circuit into the AC power.

In addition, the uninterruptible power supply device 100 is configured to convert the power from the AC power supply 201 or the battery 202, which is input to the input module 40 disposed on one side (X1 direction side) in the left-right direction by the power conversion unit 1 of each of the power conversion modules 11, 12, 21, and 22. Moreover, the uninterruptible power supply device 100 is configured to feed the power converted by the power conversion unit 1 of each of the power conversion modules 11, 12, 21, and 22 to the load 203 external to the device by outputting the power converted by the power conversion unit 1 of each of the power conversion modules 11, 12, 21, and 22 to the output module 50 disposed on the other side (X2 direction side) in the left-right direction.

Current Path of Uninterruptible Power Supply Device

In addition, in the present embodiment, the uninterruptible power supply device 100 includes an AC input path I, a DC current path D, an AC output path O, and a bypass current path B, as shown in FIG. 2.

The AC input path I is a current path provided between the AC power supply 201 external to the device and the power conversion unit 1 of each of the power conversion modules 11, 12, 21, and 22. The AC input path I is formed from the input module 40 to the control module 30 and the power conversion modules 11 and 12, and is formed from the input module 40 to the control module 30 and the power conversion modules 21 and 22. The power (AC power) received from the AC power supply 201 external to the device is input to the power conversion unit 1 of each of the power conversion modules 11, 12, 21, and 22 through the AC input path I. It should be noted that, although not shown in FIG. 2, a plurality (three) of AC input paths I is provided corresponding to the phases (U phase, V phase, and W phase) of the AC power fed from the AC power supply 201 external to the device.

In addition, the DC current path D is a current path provided between the battery 202 external to the device and the power conversion unit 1 of each of the power conversion modules 11, 12, 21, and 22. The DC current path D is formed from the control module 30 to the power conversion modules 11 and 12, and is formed from the control module 30 to the power conversion modules 21 and 22. The DC current path D is a current path for feeding the power from the battery 202 external to the device to the power conversion unit 1 when the supply of the AC power from the AC power supply 201 external to the device is stopped. The power (DC power) received from the battery 202 external to the device is input to the power conversion unit 1 of each of the power conversion modules 11, 12, 21, and 22 through the DC current path D. In addition, the DC current path D is a current path for feeding the power converted by the power conversion unit 1 of each of the power conversion modules 11, 12, 21, and 22 to the battery 202 external to the device when the AC power is fed to the power conversion unit 1 from the AC power supply 201 external to the device. It should be noted that, although not shown in FIG. 2, a plurality (two) of DC current paths D is provided corresponding to the phases (P phase and N phase) of the DC power fed from the battery 202 external to the device.

In addition, the AC output path O is a current path provided between the power conversion unit 1 of each of the power conversion modules 11, 12, 21, and 22 and the load 203 external to the device. The AC output path O is formed from the power conversion module 11 to the power conversion module 12 and the output module 50, and is formed from the power conversion module 21 to the power conversion module 22 and the output module 50. The power converted by the power conversion unit 1 of each of the power conversion modules 11, 12, 21, and 22 is output from the output module 50 to the load 203 external to the device through the AC output path O. It should be noted that, although not shown in FIG. 2, a plurality (three) of AC output paths O is provided corresponding to the phases (U phase, V phase, and W phase) of the AC power converted by the power conversion unit 1.

In addition, the bypass current path B is a current path for outputting the AC power to the load 203 external to the device without passing through the power conversion unit 1.

Specifically, the bypass current path B is a current path for outputting the AC power fed from a bypass feeding AC power supply 204 external to the device to the load 203 external to the device without passing through the power conversion unit 1. In the uninterruptible power supply device 100, the bypass current path B (bypass circuit) is formed from the input module 40 to the control module 30, as shown in FIG. 2. The bypass current path B electrically connects the bypass feeding AC power supply 204 external to the device and the AC output path O. The bypass current path B is a current path for outputting the power from the bypass feeding AC power supply 204 external to the device to the load 203 external to the device through the AC output path O. The bypass current path B is a current path used for maintenance of the power conversion modules 11, 12, 21, and 22. It should be noted that, although not shown in FIG. 2, a plurality (three) of bypass current paths B is provided corresponding to the phases (U phase, V phase, and W phase) of the AC power fed from the bypass feeding AC power supply 204 external to the device. With the configuration described above, the uninterruptible power supply device 100 is configured to output the power received from the bypass feeding AC power supply 204 external to the device to the output module 50 (load 203 external to the device) through the bypass current path B and the AC output path O.

Moreover, the control module 30 includes the thyristor unit 31 including a thyristor 31*a* provided in the bypass current path B for outputting the AC power to the load 203 external to the device without passing through the power conversion unit 1, and the control unit 32 that controls the power conversion of the power conversion modules 11, 12, 21, and 22.

In addition, the thyristor unit 31 includes a plurality (three) of thyristors 31*a* corresponding to the phases (U phase, V phase, and W phase) of the AC power fed from the bypass feeding AC power supply 204 external to the device (external to the uninterruptible power supply device 100).

In addition, the control module 30 also includes a circuit breaker 33. As shown in FIG. 2, the circuit breaker 33 is provided in the current path between the thyristor unit 31 and the power conversion unit 1 and configured to cut off the power output from the power conversion unit 1. Specifically, the circuit breaker 33 is provided between the AC output path O connected to the bypass current path B and the thyristor unit 31 in the control module 30. The circuit breaker 33 is configured to switch between a state in which the AC output path O side of the circuit breaker 33 and the thyristor unit 31 side of the circuit breaker 33 are electrically connected and a state in which the AC output path O side of the circuit breaker 33 and the thyristor unit 31 side of the circuit breaker 33 are electrically disconnected.

In addition, as shown in FIG. 2, the thyristor unit 31 and the control unit 32 are provided in common to the power conversion modules 11, 12, 21, and 22.

In addition, the input module 40 and the output module 50 are provided in common to each of power conversion modules 11, 12, 21, and 22.

The input module 40 is electrically connected to the AC power supply 201 external to the device and the bypass feeding AC power supply 204 external to the device. It should be noted that the AC power supply 201 and the bypass feeding AC power supply 204 may be the same AC power supply. Moreover, the input module 40 is configured to input the power received from the AC power supply 201 external to the device to the power conversion unit 1 of each of the power conversion modules 11, 12, 21, and 22. That is, the power conversion unit 1 of each of the power conversion modules 11, 12, 21, and 22 is electrically connected to the AC power supply 201 external to the device through the input module 40. In addition, the input module 40 is configured to input the power received from the bypass feeding AC power supply 204 external to the device to a plurality (three) of thyristors 31*a* corresponding to the phases (U phase, V phase, and W phase) of the power received from the bypass feeding AC power supply 204 external to the device. That is, the control module 30 is electrically connected to the bypass feeding AC power supply 204 external to the device through the input module 40.

In addition, the output module 50 is electrically connected to the power conversion unit 1 of each of the power conversion modules 11, 12, 21, and 22 and the load 203 external to the device. The output module 50 is configured to output the power converted by the power conversion unit 1 of each of the power conversion modules 11, 12, 21, and 22 to the load 203 external to the device.

In addition, the output module 50 may be configured to receive the input of the power converted by the power conversion unit 1 of each of the power conversion modules 11, 12, 21, and 22, and may be configured to branch the power to the load 203 external to the device. For example, a configuration may be adopted in which a plurality of loads 203 is connected to the output module 50, and the input power is branched according to each of the connected plurality of loads 203.

Figure 3:
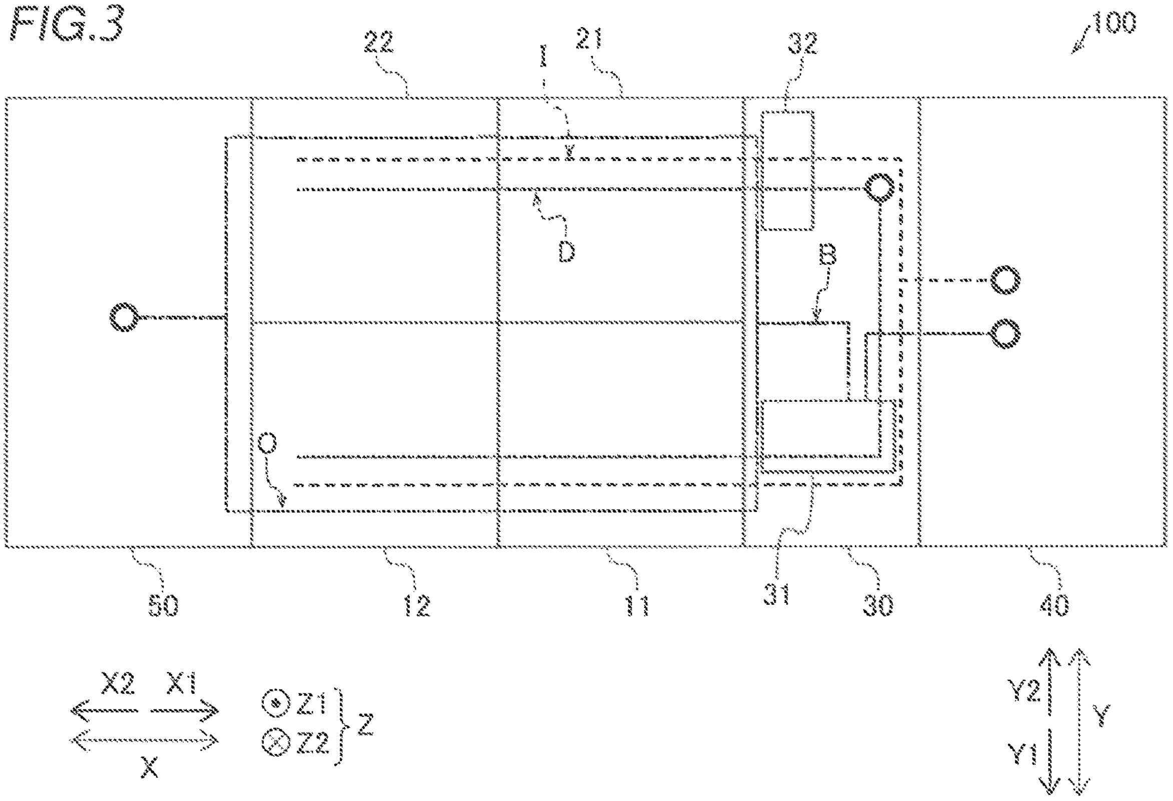
FIG. 3 is a schematic view showing dispositions of each module of the uninterruptible power supply device as viewed from above (Z1 direction side).

Moreover, as shown in FIG. 3, the power conversion modules 11 and 12 are disposed on one side (Y1 direction side) in the front-rear direction in which thyristor unit 31 is disposed. In addition, the power conversion modules 21 and 22 are disposed on the other side (Y2 direction side) in the front-rear direction in which the control unit 32 is disposed. In addition, each current path (AC input path I, AC output path O, and DC current path D) in the power conversion modules 11 and 12 is provided on one side (Y1 direction side) in the front-rear direction in the power conversion modules 11 and 12. Moreover, each current path (AC input path I, AC output path O, and DC current path D) in the power conversion modules 21 and 22 is provided on the other side (Y2 direction side) in the front-rear direction in the power conversion modules 21 and 22. That is, each current path (AC input path I, AC output path O and DC current path D) in the power conversion modules 11, 12, 21, and 22 is provided on the front side of each module.

Configuration of Control Module

Figure 4:
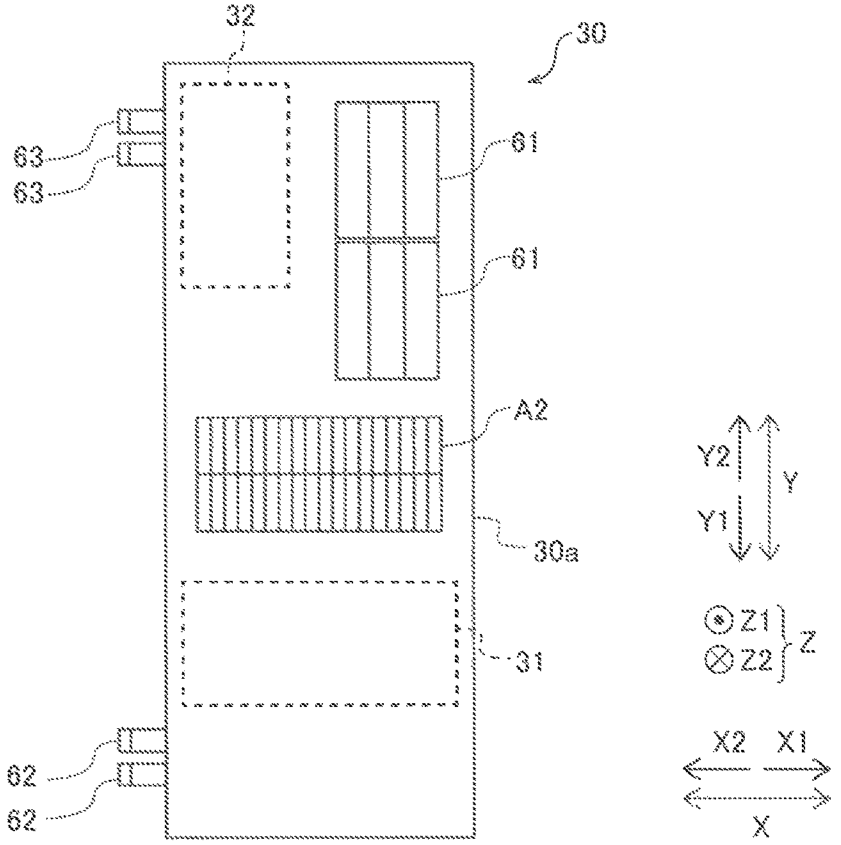
FIG. 4 is a view showing disposition of a thyristor unit and a control unit in a housing of a control module as viewed from above (Z1 direction side).

As shown in FIG. 4, the thyristor unit 31 and the control unit 32 are arranged in the front-rear direction (Y direction) intersecting the left-right direction (X direction) in the housing 30*a* of the control module 30. In addition, as shown in FIG. 4, the thyristor unit 31 and the control unit 32 are disposed in the housing 30*a* of the control module 30 to overlap each other as viewed from the front-rear direction (Y1 direction side or Y2 direction side).

In addition, the exhaust unit A2 provided on the upper surface (surface on the Z1 direction side) of the housing 30*a* of the control module 30 is provided between the thyristor unit 31 and the control unit 32 in the front-rear direction (Y direction). In addition, the exhaust unit A2 is provided between the thyristor unit 31 and the bus duct 61 in the front-rear direction (Y direction). In addition, in the present embodiment, the bus duct 61 is provided on one side (X1 direction side) in the left-right direction with respect to the control module 30. Moreover, the control unit 32 is disposed on the other side (X2 direction side) in the left-right direction with respect to the bus duct 61.

Figure 5:
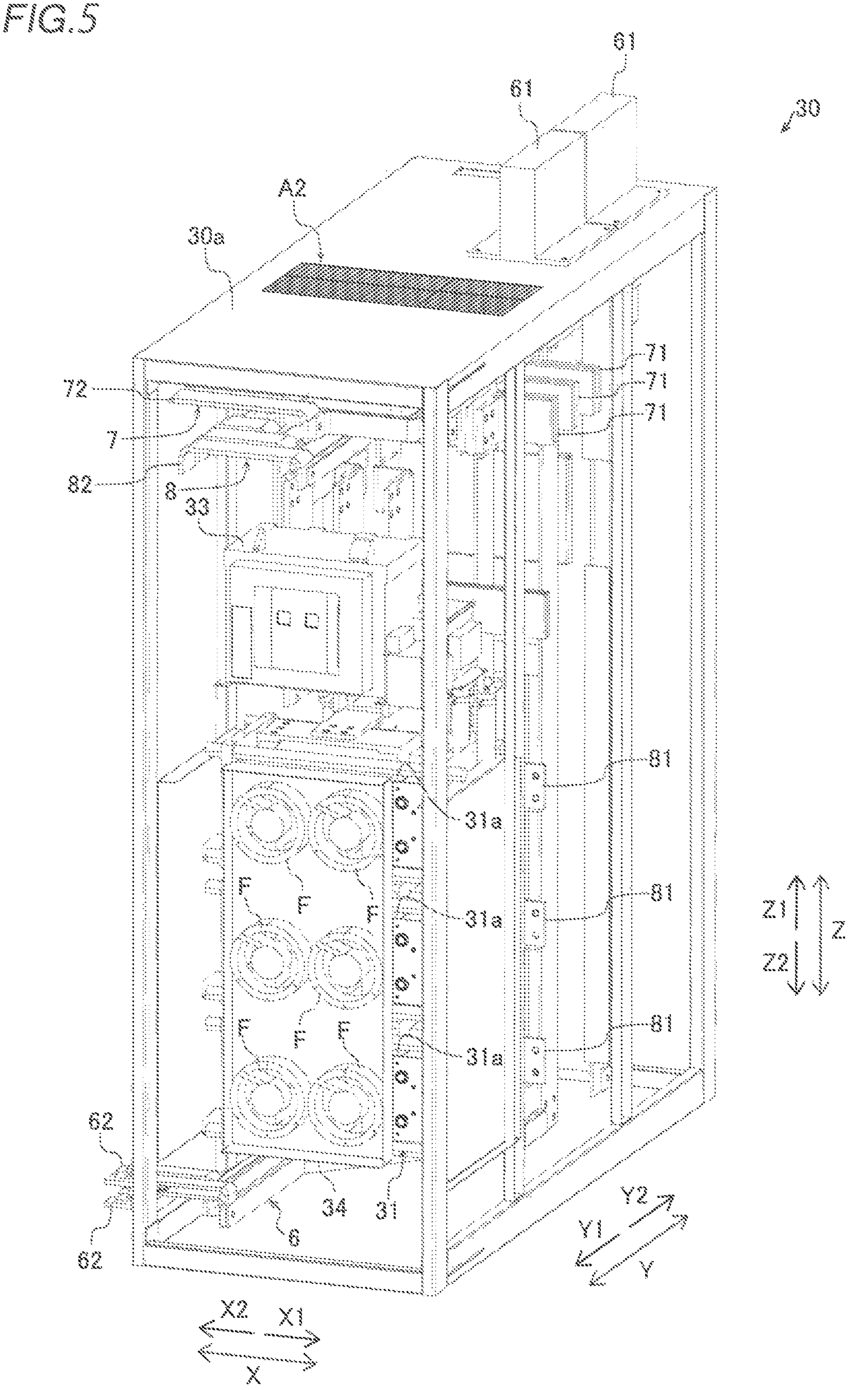
FIG. 5 is a perspective view showing a connector on an input module side of the control module.

In addition, the housing 30*a* of the control module 30 accommodates the thyristor unit 31, the control unit 32, and the circuit breaker 33, as shown in FIG. 5. Moreover, the control module 30 includes a fan unit 34 provided on one side (Y1 direction side) in the front-rear direction of the thyristor unit 31 in the housing 30*a*. The fan unit 34 includes a plurality of fans F for blowing air taken in from the outside of the housing 30*a* to the thyristor unit 31 (thyristor 31*a*) through the air intake unit A1 (see FIG. 1). The air blown by the plurality of fans F is exhausted from the exhaust unit A2 provided in the upper portion (Z1 direction) of the housing 30*a*. In addition, two fans F are provided for each of the plurality (three) of thyristors 31*a* (see FIGS. 5 and 6) of the thyristor unit 31. That is, six fans F are provided.

Figure 6:
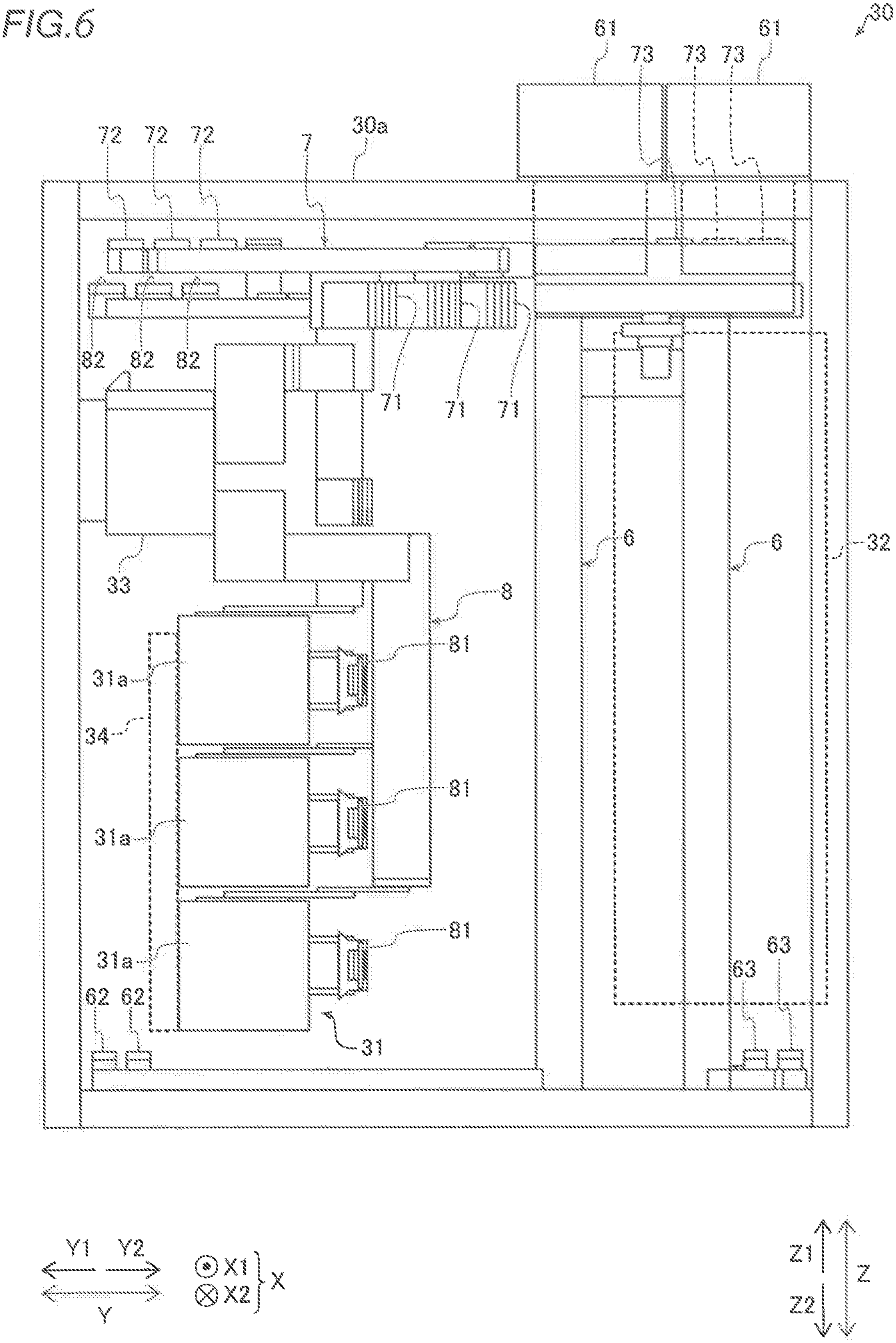
FIG. 6 is a side view of the control module as viewed from the input module side.

Moreover, in the thyristor unit 31, as shown in FIG. 6, a plurality (three) of thyristors 31*a* is arranged in an up-down direction. In addition, the thyristor unit 31 is disposed on one side (Y1 direction side) in the front-rear direction with respect to the center of the housing 30*a* of the control module 30, as shown in FIG. 6. In addition, the control unit 32 is disposed on the other side (Y2 direction side) in the front-rear direction with respect to the center of the housing 30*a* of the control module 30.

In addition, the control unit 32 includes a control board (circuit board) on which a central processing unit (CPU), a read only memory (ROM), or a random access memory (RAM) is mounted. In addition, the control unit 32 includes a control board for controlling the driving of the fan F of the fan unit 34, in addition to a control board for controlling the power conversion of each of the power conversion modules 11, 12, 21, and 22.

In addition, the control module 30 is provided with a DC wiring 6 (see FIGS. 5 and 6) that is electrically connected to the power conversion unit 1 of each of the power conversion modules 11, 12, 21, and 22 and the battery 202 external to the device. The DC wiring 6 is wiring that forms the DC current path D in the control module 30. That is, a plurality (two) of DC wirings 6 is provided corresponding to the phases (P phase and N phase) of the DC power fed from the battery 202 external to the device. The DC wiring 6 includes a conductor wiring having a plate shape. For example, the DC wiring 6 is formed by a plurality of interconnected copper bars.

Moreover, the bus duct 61 provided in the upper portion of the housing 30*a* of the control module 30 is configured to electrically connect the battery 202 (see FIG. 2) external to the device and the DC wiring 6. In addition, as described above, the bus duct 61 accommodates a conductor wiring, such as copper, and an insulating material that supports or coats the conductor wiring in a metal duct. Moreover, the DC wiring 6 is connected to the conductor wiring of the bus duct 61 that is electrically connected to the battery 202 external to the device. In addition, the bus duct 61 is provided for each of the plurality (two) of DC wirings 6. That is, a plurality (two) of bus duct 61 is provided corresponding to the phases (P phase and N phase) of the DC power fed from the battery 202 external to the device. It should be noted that the plurality (two) of bus ducts 61 may be provided as in the present embodiment, or may be connected to each wiring conductor as one conductor of a two-wiring type.

In addition, the control module 30 is provided with an AC input wiring 7 that is electrically connected to the power conversion unit 1 of each of the power conversion modules 11, 12, 21, and 22 and the AC power supply 201 external to the device. The AC input wiring 7 (see FIGS. 5 and 6) is a wiring that forms s the AC input path I in the control module 30. That is, a plurality (three) of AC input wirings 7 is provided corresponding to the phases (U phase, V phase, and W phase) of the AC power fed from the AC power supply 201 external to the device. The AC input wiring 7 includes a conductor wiring having a plate shape. For example, the AC input wiring 7 is configured by a plurality of interconnected copper bars.

In addition, the AC input wiring 7 includes a connector 71 (see FIGS. 5 and 6) that is disposed between the thyristor unit 31 and the control unit 32 in the front-rear direction (Y direction), and is connected to the wiring of the input module 40 (see FIG. 2). It should be noted that the connector 71 is an example of a "AC input connection unit connector" in the scope of claims. The connector 71 is provided for each of the plurality (three) of the AC input wirings 7. That is, a plurality (three) of connectors 71 is provided corresponding to the phases (U phase, V phase, and W phase) of the AC power fed from the AC power supply 201 external to the device.

In addition, as shown in FIGS. 5 and 6, the control module 30 is provided with a bypass wiring 8 that is connected to the thyristor 31*a* of the thyristor unit 31 and forms the bypass current path B. That is, a plurality (three) of bypass wirings 8 is provided corresponding to the phases (U phase, V phase, and W phase) of the AC power fed from a bypass feeding AC power supply 204 external to the device. The bypass wiring 8 includes a conductor wiring having a plate shape. For example, bypass wiring 8 is formed by a plurality of interconnected copper bars.

In addition, the bypass wiring 8 includes a connector 81 (see FIGS. 5 and 6) that is disposed between the thyristor unit 31 and the control unit 32 in the front-rear direction (Y direction), and is connected to the wiring of the input module 40 (see FIG. 2). It should be noted that the connector 81 is an example of a "bypass path-connection unit connector" in the scope of claims. The connector 81 is provided for each of the plurality (three) of bypass wirings 8. That is, a plurality (three) of connectors 81 is provided corresponding to the phases (U phase, V phase, and W phase) of the AC power fed from the bypass feeding AC power supply 204 external to the device. The plurality of connectors 81 is arranged in the up-down direction (Z direction) corresponding to the thyristor 31*a*.

In addition, as shown in FIG. 6, the circuit breaker 33 is disposed on the upper portion of the thyristor unit 31. The circuit breaker 33 is connected to the bypass wiring 8 that forms the bypass current path B (see FIG. 2). Moreover, the circuit breaker 33 is electrically connected to the thyristor 31*a* of the thyristor unit 31 through the bypass wiring 8. In addition, the circuit breaker 33 is provided in common to the plurality of thyristors 31*a*. Moreover, the plurality of thyristors 31*a* of the thyristor unit 31 is electrically connected to the wiring of the input module 40 through the bypass wiring 8 (connector 81). In addition, the circuit breaker 33 is electrically connected to the AC output path O (see FIG. 2) through the bypass wiring 8.

In addition, in the control module 30, as shown in FIG. 6, the bus duct 61, the connector 71, and the connector 81 are provided in this order from above (Z1 direction side) in the housing 30*a*. In addition, the thyristor unit 31 is disposed below the connector 71 (Z2 direction side). In addition, the thyristor unit 31 is disposed between the connector 71 and a connection unit 62 (connection unit 63), which will be described below, in the up-down direction (Z direction).

Figure 7:
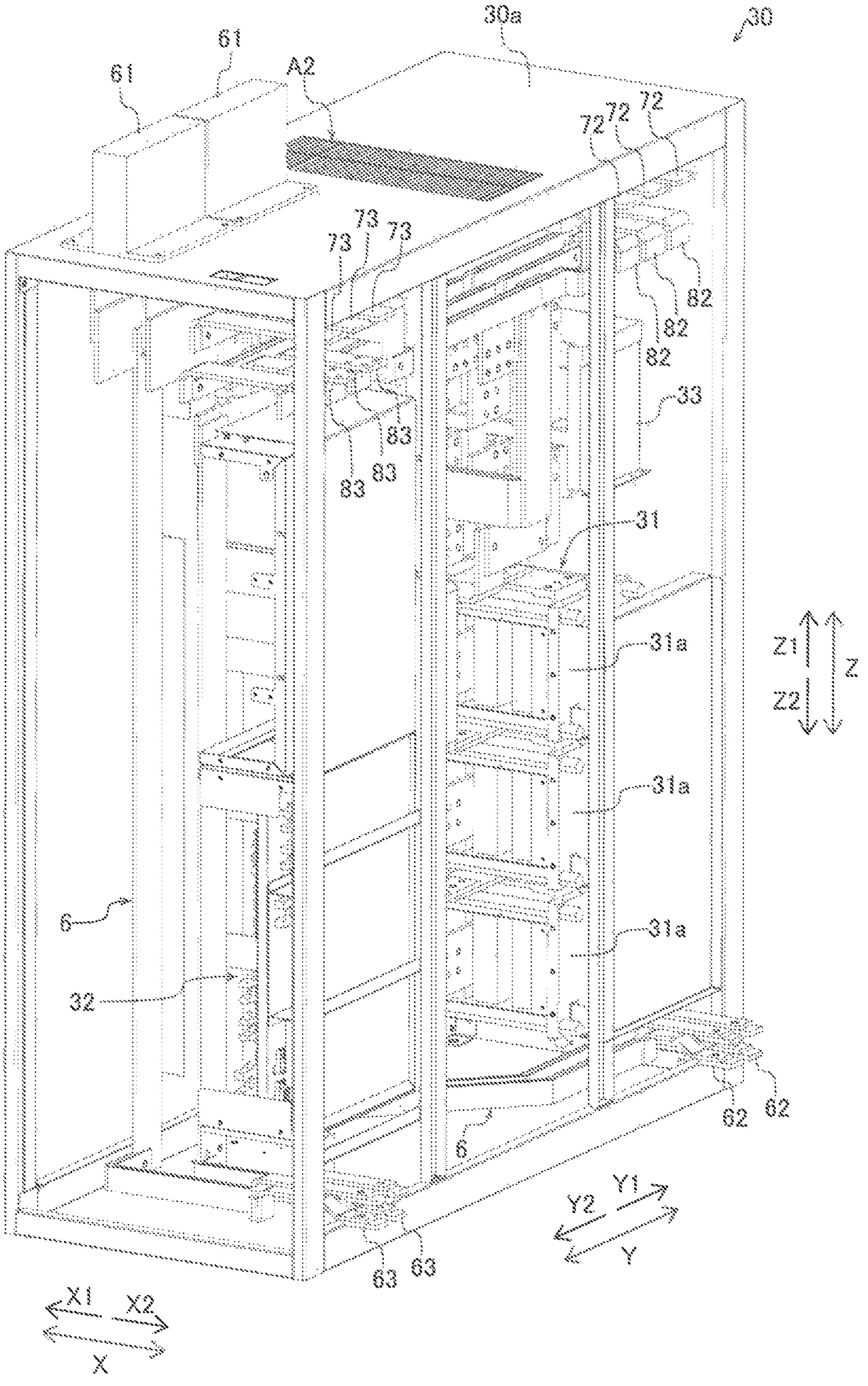
FIG. 7 is a perspective view showing a connection unit on a power conversion module side of the control module.
Figure 8:
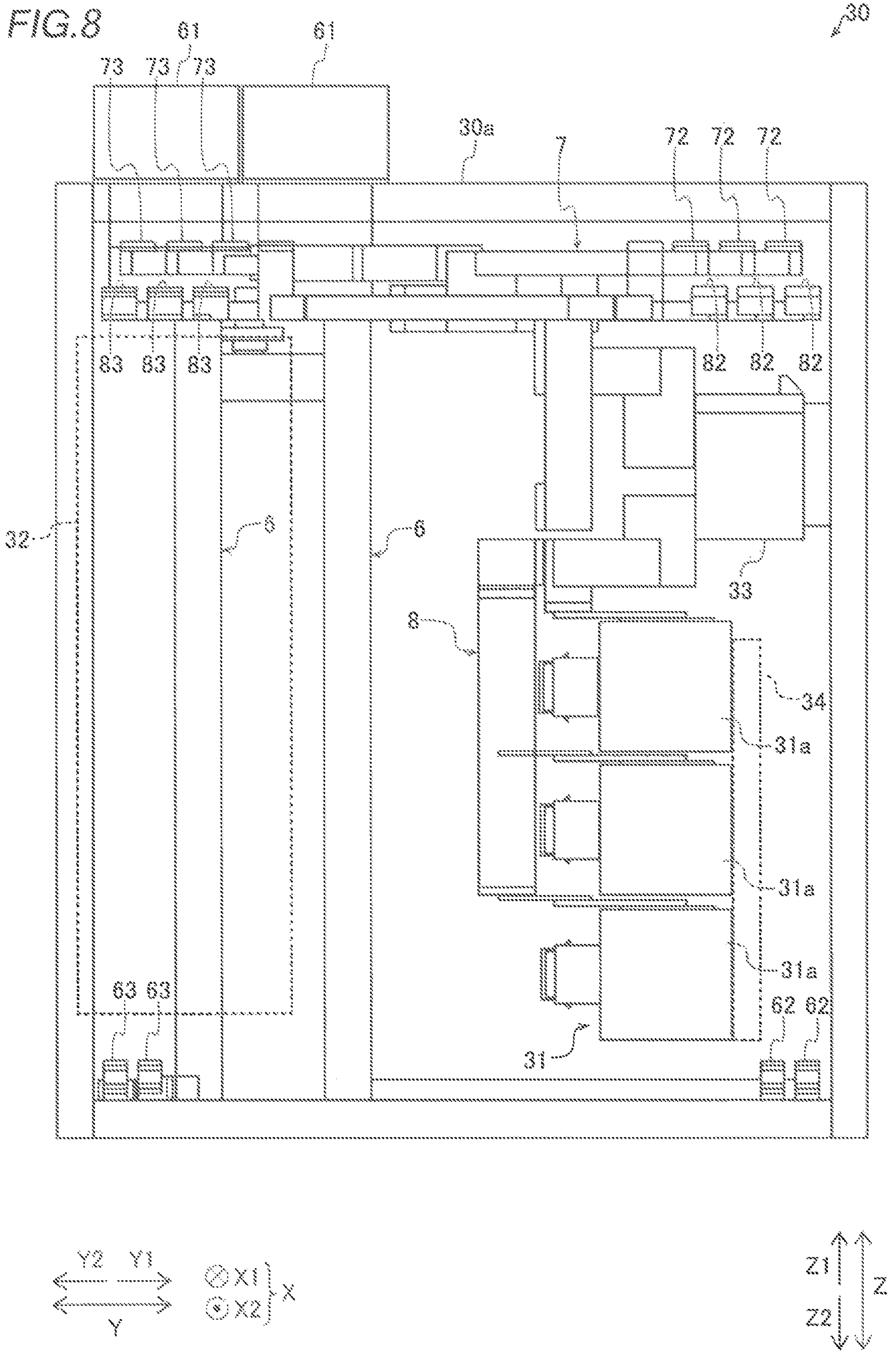
FIG. 8 is a side view of the control module as viewed from the power conversion module side.

As shown in FIGS. 7 and 8, the DC wiring 6 includes the connection unit 62 that is provided on one side (Y1 direction side) in the front-rear direction and is connected to the wiring of the power conversion module 11 (see FIG. 2). In addition, the DC wiring 6 includes the connection unit 63 that is provided on the other side (Y2 direction side) in the front-rear direction and is connected to the wiring of the power conversion module 21 (see FIG. 2). The connection units 62 and 63 are provided for each of the plurality (two) of the DC wirings 6. That is, a plurality (two) of connection units 62 and 63 is provided corresponding to the phases (P phase and N phase) of the DC power fed from the battery 202 external to the device.

As shown in FIGS. 7 and 8, the AC input wiring 7 includes a connection unit 72 that is provided on one side (Y1 direction side) in the front-rear direction and is connected to the wiring of the power conversion module 11 (see FIG. 2). In addition, the AC input wiring 7 includes a connection unit 73 that is provided on the other side (Y2 direction side) in the front-rear direction and is connected to the wiring of the power conversion module 21 (see FIG. 2). The connection units 72 and 73 are provided for each of the plurality (three) of the AC input wirings 7. That is, a plurality (three) of connection units 72 and 73 is provided corresponding to the phases (U phase, V phase, and W phase) of the AC power fed from the AC power supply 201 external to the device.

As shown in FIGS. 7 and 8, the bypass wiring 8 includes a connection unit 82 that is disposed on one side (Y1 direction side) in the front-rear direction and is connected to the wiring of the power conversion module 11 (see FIG. 2). In addition, the bypass wiring 8 includes a connection unit 83 that is disposed on the other side (Y2 direction side) in the front-rear direction and is connected to the wiring of the power conversion module 21 (see FIG. 2). The connection units 82 and 83 are provided for each of the plurality (three) of bypass wirings 8. That is, a plurality (three) of connection units 82 and 83 is provided corresponding to the phases (U phase, V phase, and W phase) of the AC power fed from the bypass feeding AC power supply 204 external to the device.

In the control module 30, as shown in FIG. 8, the bus duct 61, the connection unit 72 (connection unit 73), the connection unit 82 (connection unit 83), and the connection unit 62 (connection unit 63) are provided in this order from above (Z1 direction side) in the housing 30*a*. In addition, the connection unit 62 is provided on the Y1 direction side with respect to the thyristor unit 31. It should be noted that the connection unit 72, the connection unit 82, and the connection unit 62 are provided at positions corresponding to the positions of the wirings forming the current paths (AC input path I, AC output path O, and DC current path D) of the power conversion module 11, respectively. In addition, the connection unit 73, the connection unit 83, and the connection unit 63 are provided at positions corresponding to the positions of the wirings forming the current paths (AC input path I, AC output path O, and DC current path D) of the power conversion module 12, respectively.

In addition, the thyristor unit 31 is disposed between the connection unit 82 and the connection unit 62 in the up-down direction (Z direction). In addition, the control unit 32 is disposed between the connection unit 83 and the connection unit 63 in the up-down direction (Z direction).

Effects of Present Embodiment

The following effects can be obtained in the present embodiment.

In the present embodiment, the thyristor unit 31 and the control unit 32 are arranged in the front-rear direction (Y direction) intersecting the left-right direction in the housing 30*a* of the control module 30. As a result, the width W1 in the left-right direction of the control module 30 can be made smaller than the width in a case in which the thyristor unit 31 and the control unit 32 are arranged in the left-right direction (X direction) in the housing 30*a* of the control module 30. As a result, it is possible to suppress the increase in the width W1 in the left-right direction (X direction) of the control module 30 forming the uninterruptible power supply device 100, and to suppress the increase in the width in the left-right direction of the entire uninterruptible power supply device 100.

In addition, in the present embodiment, as described above, the thyristor unit 31 and the control unit 32 are disposed in the housing 30*a* of the control module 30 to overlap each other as viewed from the front-rear direction (Y1 direction side or Y2 direction side). As a result, the width W1 in the left-right direction (X direction) of the housing 30*a* of the control module 30 can be made smaller than the width in a case in which the thyristor unit 31 and the control unit 32 do not overlap each other as viewed from the front-rear direction (Y1 direction side or Y2 direction side) in the housing 30*a* of the control module 30. As a result, it is possible to easily suppress the increase in the width in the left-right direction (X direction) of the entire uninterruptible power supply device 100.

In addition, in the present embodiment, as described above, the thyristor unit 31 is disposed on one side (Y1 direction side) in the front-rear direction with respect to the center of the housing 30*a* of the control module 30. Moreover, the control unit 32 is disposed on the other side (Y2 direction side) in the front-rear direction with respect to the center of the housing 30*a* of the control module 30. As a result, during installation and maintenance of the device, the thyristor unit 31 can be easily accessed from one side (Y1 direction side) in the front-rear direction, and the control unit 32 can be easily accessed from the other side (Y2 direction side) in the front-rear direction. As a result, unlike a case in which both the thyristor unit 31 and the control unit 32, which are arranged in the front-rear direction (Y direction), are disposed in the housing 30*a* of the control module 30 to one side (Y1 direction side) or the other side (Y2 direction side) in the front-rear direction from the center of the housing 30*a*, both the thyristor unit 31 and the control unit 32 can be easily accessed during installation and maintenance of the device. As a result, it is possible to improve workability during installation and maintenance of the device.

In addition, in the present embodiment, as described above, the input module 40 that is disposed on one side (X1 direction side) in the left-right direction with respect to the control module 30 and inputs AC power fed from the AC power supply 201 external to the device to the control module 30 is provided. Moreover, the width W1 in the left-right direction (X direction) of the control module 30 is smaller than the width W6 in the left-right direction of the input module 40. As a result, the width W1 in the left-right direction (X direction) of the control module 30 can be made smaller than a case in which the width W1 in the left-right direction of the control module 30 is made larger than the width W6 in the left-right direction of the input module 40, so that it is possible to further suppress the increase in the width in the left-right direction of the entire uninterruptible power supply device 100.

In addition, in the present embodiment, as described above, the power conversion modules 11, 12, 21, and 22 are disposed on the other side (X2 direction side) in the left-right direction with respect to the control module 30. Moreover, the thyristor unit 31 and the control unit 32 are provided in common to the power conversion modules 11, 12, 21, and 22. As a result, the power conversion modules 11 and 12 are disposed on one side (Y1 direction side) in the front-rear direction on which the thyristor unit 31 is disposed, and the power conversion modules 21 and 22 are disposed on the other side (Y2 direction side) in the front-rear direction on which the control unit 32 is disposed, so that it is possible to further suppress the increase in the width in the left-right direction of the entire uninterruptible power supply device 100 than in a case in which the power conversion modules 11, 12, 21, and 22 are disposed in a row in the left-right direction (X direction). In addition, the thyristor unit 31 and the control unit 32 are provided in common to the power conversion modules 11, 12, 21, and 22, so that it is possible to suppress an increase in the number of components and complication of the device configuration than in a case in which the thyristor unit 31 and the control unit 32 are provided separately for each of the power conversion modules 11, 12, 21, and 22.

In addition, in the present embodiment, as described above, the width W1 in the left-right direction (X direction) of the control module 30 is smaller than each of the widths W2, W3, W4, and W5 in the left-right direction of the power conversion modules 11, 12, 21, and 22. As a result, the width W1 in the left-right direction of the control module 30 can be made smaller than a case in which the width W1 in the left-right direction (X direction) of the control module 30 is made larger than each of the widths W2, W3, W4, and W5 in the left-right direction of the power conversion modules 11, 12, 21, and 22, so that it is possible to further suppress the increase in the width in the left-right direction of the entire uninterruptible power supply device 100.

In addition, in the present embodiment, the control module 30 is provided with the bypass wiring 8 that is connected to the thyristor 31*a* of the thyristor unit 31 and forms the bypass current path B. Moreover, the bypass wiring 8 includes the connector 81 that is disposed between the thyristor unit 31 and the control unit 32 in the front-rear direction (Y direction), and is connected to the wiring of the input module 40. As a result, it is possible to make the width W1 in the left-right direction of the control module 30 smaller than in a case in which the connector 81 is disposed adjacent to the thyristor unit 31 or the control unit 32 in the left-right direction (X direction) in the housing 30*a* of the control module 30.

In addition, in the present embodiment, as described above, the control module 30 is provided with the AC input wiring 7 that is electrically connected to the power conversion unit 1 of each of the power conversion modules 11, 12, 21, and 22 and the AC power supply 201 external to the device. Moreover, the AC input wiring 7 includes the connector 71 that is disposed between the thyristor unit 31 and the control unit 32 in the front-rear direction (Y direction), and is connected to the wiring of the input module 40. As a result, it is possible to make the width W1 in the left-right direction of the control module 30 smaller than a case in which the connector 71 is disposed adjacent to the thyristor unit 31 or the control unit 32 in the left-right direction (X direction) in the housing 30*a* of the control module 30.

In addition, in the present embodiment, as described above, the control module 30 is provided with the DC wiring 6 that is electrically connected to the power conversion unit 1 of each of the power conversion modules 11, 12, 21, and 22 and the battery 202 external to the device. Moreover, the control module 30 includes the bus duct 61 that is provided in the upper portion of the housing 30*a* and electrically connects the battery 202 external to the device and the DC wiring 6. As a result, the cable or the like connected to the battery 202 external to the device can be connected to the bus duct 61 provided on the upper portion of the housing 30*a*. As a result, unlike a case in which the bus duct 61 is provided on the direction side (X2 direction side) of the control module 30 to which the power conversion modules 11, 12, 21, and 22 are adjacent, even in a case in which the battery 202 external to the device is disposed on the direction side on which the power conversion modules 11, 12, 21, and 22 are adjacent to the control module 30, it is possible to electrically connect the DC wiring 6 of the control module 30 and the battery 202 external to the device from above the housing 30*a* without passing through the power conversion modules 11, 12, 21, and 22. As a result, unlike a case in which the bus duct 61 is provided on the direction side (X2 direction side) of the control module 30 to which the power conversion modules 11, 12, 21, and 22 are adjacent, it is possible to easily perform electrical connection between the DC wiring 6 of the control module 30 and the battery 202 external to the device.

In addition, in the present embodiment, as described above, the output module 50 that is disposed on the other side (X2 direction side) in the left-right direction with respect to the power conversion modules 11, 12, 21, and 22, and outputs the power converted by the power conversion unit 1 of each of the power conversion modules 11, 12, 21, and 22 to the load 203 external to the device is provided. Moreover, the width W1 in the left-right direction (X direction) of the control module 30 is smaller than the width W7 in the left-right direction of the output module 50. As a result, the width W1 in the left-right direction (X direction) of the control module 30 can be made smaller than a case in which the width W1 in the left-right direction of the control module 30 is made larger than the width W7 of the output module 50, so that it is possible to further suppress the increase in the width in the left-right direction of the entire uninterruptible power supply device 100.

MODIFICATION EXAMPLE

It should be noted that the embodiment disclosed this time is an exemplary example in all respects and is not considered to be restrictive. The scope of the present invention is shown by the scope of claims, not the description of the embodiment, and further includes all changes (modification examples) within the meaning and the scope equivalent to the scope of claims.

For example, in the embodiment described above, the example has been described in which the uninterruptible power supply device 100 includes four power conversion modules (power conversion modules 11, 12, 21, and 22), but the present invention is not limited to this. For example, the uninterruptible power supply device may have a configuration including one or more and three or less power conversion modules, or may have a configuration including five or more power conversion modules.

In addition, in the embodiment described above, the example has been described in which the power conversion modules 11 and 12 are disposed on one side (Y1 direction side) in the front-rear direction with respect to the power conversion modules 21 and 22, but the present invention is not limited to this. In the present invention, a plurality of power conversion modules may be arranged in a row. In addition, in the present invention, a plurality of power conversion modules may be arranged in three or more rows.

In addition, in the embodiment described above, the example has been described in which the thyristor unit 31 is disposed on one side (Y1 direction side) in the front-rear direction with respect to the center of the housing 30*a* of the control module 30, and the control unit 32 is disposed on the other side (Y2 direction side) in the front-rear direction with respect to the center of the housing 30*a* of the control module 30, but the present invention is not limited to this. In the present invention, both the thyristor unit and the control unit arranged in the front-rear direction may be disposed to be biased to one side or the other side in the front-rear direction from the center of the housing in the housing of the control module.

In addition, in the embodiment described above, the example has been described in which the width W1 in the left-right direction (X direction) of the control module 30 is smaller than the width W6 in the left-right direction of the input module 40, but the present invention is not limited to this. In the present invention, the width in the left-right direction of the control module may be larger than the width in the left-right direction of the input module, or may be substantially the same as the width in the left-right direction of the input module.

In addition, in the embodiment described above, the example has been described in which the thyristor unit 31 and the control unit 32 are provided in common to the power conversion modules 11, 12, 21, and 22, but the present invention is not limited to this. In the present invention, the thyristor unit and the control unit may be provided corresponding to each of the plurality of power conversion modules.

In addition, in the embodiment described above, the example has been described in which the width W1 in the left-right direction (X direction) of the control module 30 is smaller than each of the widths W2, W3, W4, and W5 in the left-right direction of the power conversion modules 11, 12, 21, and 22, but the present invention is not limited to this. In the present invention, the width in the left-right direction of the control module may be larger than the width in the left-right direction of the power conversion module, or may be substantially the same as the width in the left-right direction of the power conversion module.

In addition, in the embodiment described above, the example has been described in which the bypass wiring 8 includes the connector 81 (bypass path connection unit connector) that is disposed between the thyristor unit 31 and the control unit 32 in the front-rear direction (Y direction), and is connected to the wiring of the input module 40, but the present invention is not limited to this. In the present invention, the bypass path connector may be disposed adjacent to the thyristor unit or the control unit in the left-right direction.

In addition, in the embodiment described above, the example has been described in which the AC input wiring 7 includes the connector 71 (AC input connection unit connector) that is disposed between the thyristor unit 31 and the control unit 32 in the front-rear direction (Y direction), and is connected to the wiring of the input module 40, but the present invention is not limited to this. In the present invention, the AC input connector may be disposed adjacent to the thyristor unit or the control unit in the left-right direction.

In addition, in the embodiment described above, the example has been described in which the control module 30 includes the bus duct 61 (battery connection unit) that is electrically connected to the battery 202 external to the device, but the present invention is not limited to this. In the present invention, the control module may be electrically connected to the battery external to the device through the input module.

In addition, in the embodiment described above, the example has been described in which the width W1 in the left-right direction (X direction) of the control module 30 is smaller than the width W7 in the left-right direction of the output module 50, but the present invention is not limited to this. In the present invention, the width in the left-right direction of the control module may be larger than the width in the left-right direction of the output module, or may be substantially the same as the width in the left-right direction of the output module.

In addition, in the embodiment described above, the example has been described in which the input module 40 and the output module 50 are separately provided in the uninterruptible power supply device 100, but the present invention is not limited to this. In the present invention, the input module and the output module may be integrally formed and one side or the other side in the left-right direction of the uninterruptible power supply device may be configured to perform both the input and output of the power.

What is claimed is:

1. An uninterruptible power supply device comprising:
- a plurality of power conversion modules,
  - each of the plurality of power conversion modules that includes a power conversion unit that converts power fed from an AC power supply or a battery external to the device and feeds the converted power to a load external to the device; and
- a control module that is disposed adjacent to the plurality of power conversion modules in a left-right direction and controls power conversion of the plurality of power conversion modules,
- wherein the control module includes
  - a thyristor unit that includes a thyristor provided in a bypass current path for outputting AC power to the load external to the device without passing through the power conversion unit of said each of the plurality of power conversion modules,
  - a control unit that controls the power conversion of the plurality of power conversion modules, and
  - a housing that accommodates the thyristor unit and the control unit,
- the thyristor unit and the control unit are arranged in a front-rear direction intersecting the left-right direction in the housing of the control module,
- the plurality of power conversion modules further includes
  - a first power conversion module and
  - a second power conversion module,
- a first housing that accommodates the first power conversion module and a second housing that accommodates the second power conversion module are disposed along the front-rear direction,
- a front surface of the first housing is configured to be exposed so as to be accessible to the first power conversion module accommodated inside the first housing from outside the first housing, and a front surface of the second housing is configured to be exposed so as to be accessible to the second power conversion module accommodated inside the second housing from outside the second housing,
- the housing is disposed on a side in the left-right direction with respect to the first housing and the second housing, both the first housing that accommodates the first power conversion module and the second housing that accommodates the second power conversion module are arranged opposite to one side portion of the housing of the control module in the left-right direction, the control module is provided with a first connector to electrically connect with the first power conversion module, and a second connector to electrically connect with the second power conversion module, and the first connector and the second connector are provided on the one side portion of the control module in the left-right direction where both the first housing that accommodates the first power conversion module and the second housing that accommodates the second power conversion module are arranged.

2. The uninterruptible power supply device according to claim 1, wherein the thyristor unit and the control unit are disposed in the housing of the control module to overlap each other as viewed from the front-rear direction.

3. The uninterruptible power supply device according to claim 1, wherein the thyristor unit is disposed on one side in the front-rear direction with respect to a center of the housing of the control module, and the control unit is disposed on another side in the front-rear direction with respect to the center of the housing of the control module.

4. The uninterruptible power supply device according to claim 1, further comprising:

an input module that is disposed on one side in the left-right direction with respect to the control module and inputs the AC power fed from the AC power supply external to the device to the control module, wherein a width in the left-right direction of the control module is smaller than a width in the left-right direction of the input module.

5. The uninterruptible power supply device according to claim 4, wherein the first power conversion module is disposed on one side in the front-rear direction on which the thyristor unit is disposed, the second power conversion module is disposed on another side in the front-rear direction on which the control unit is disposed, the first power conversion module and the second power conversion module are disposed on the another side in the left-right direction with respect to the control module, and the thyristor unit and the control unit are provided in common to the first power conversion module and the second power conversion module.

6. The uninterruptible power supply device according to claim 5, wherein the width in the left-right direction of the control module is smaller than a width in the left-right direction of each of the first power conversion module and the second power conversion module.

7. The uninterruptible power supply device according to claim 4, wherein the control module is provided with a bypass wiring that is connected to the thyristor of the thyristor unit and forms the bypass current path, and the bypass wiring includes a bypass path connector that is disposed between the thyristor unit and the control unit in the front-rear direction and is connected to a wiring of the input module.

8. The uninterruptible power supply device according to claim 4, wherein the control module is provided with an AC input wiring that is electrically connected to the power conversion unit of said each of the plurality power conversion modules and the AC power supply external to the device, and the AC input wiring includes an AC input connector that is disposed between the thyristor unit and the control unit in the front-rear direction and is connected to a wiring of the input module.

9. The uninterruptible power supply device according to claim 1, wherein the control module is provided with a DC wiring that is electrically connected to the power conversion unit of said each of the plurality of power conversion modules and the battery external to the device, and the control module includes a battery connection unit that is provided in an upper portion of the housing and electrically connects the battery external to the device and the DC wiring.

10. The uninterruptible power supply device according to claim 1, further comprising:

an output module that is disposed on another side in the left-right direction with respect to the plurality of power conversion modules and outputs the power converted by the power conversion unit of said each of the plurality of power conversion modules to the load external to the device, wherein a width in the left-right direction of the control module is smaller than a width in the left-right direction of the output module.

11. A control module for an uninterruptible power supply device, the control module comprising:

a control unit that controls power conversion of a plurality of power conversion modules, each of the plurality of power conversion modules including a power conversion unit that converts power fed from an AC power supply or a battery external to the device and feeds converted power to a load external to the device;

a thyristor unit that includes a thyristor provided in a bypass current path for outputting AC power to the load external to the device without passing through the power conversion unit of said each of the plurality of power conversion modules; and a housing that accommodates the thyristor unit and the control unit, wherein the control module is disposed adjacent to the plurality of power conversion modules in a left-right direction, the thyristor unit and the control unit are arranged in a front-rear direction intersecting the left-right direction in the housing, the plurality of power conversion modules further includes a first power conversion module and a second power conversion module, a first housing that accommodates the first power conversion module and a second housing that accommodates the second power conversion module are disposed along the front-rear direction, a front surface of the first housing is configured to be exposed so as to be accessible to the first power conversion module accommodated inside the first housing from outside the first housing, and a front surface of the second housing is configured to be exposed so as to be accessible to the second power conversion module accommodated inside the second housing from outside the second housing, the housing is disposed on a side in the left-right direction with respect to the first housing and the second housing, both the first housing that accommodates the first power conversion module and the second housing that accommodates the second power conversion module are arranged opposite to one side portion of the housing of the control module in the left-right direction, the control module is provided with a first connector to electrically connect with the first power conversion module, and a second connector to electrically connect with the second power conversion module, and the first connector and the second connector are provided on the one side portion of the control module in the left-right direction where both the first housing that accommodates the first power conversion module and the second housing that accommodates the second power conversion module are arranged.

12. The uninterruptible power supply device according to claim 1, wherein the second housing is different from the first housing.

13. The control module according to claim 11, wherein the second housing is different from the first housing.

* * * * *